(12) United States Patent
Peng

(10) Patent No.: US 11,335,874 B2
(45) Date of Patent: May 17, 2022

(54) QUANTUM DOT COLOR FILTER SUBSTRATE, FABRICATING METHOD THEREOF, AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Wenxiang Peng, Shenzhen (CN)

(*) Notice: Subject to any disclaimer, the term of this patent is extended or adjusted under 35 U.S.C. 154(b) by 172 days.

(21) Appl. No.: 16/625,714

(22) PCT Filed: Nov. 18, 2019

(86) PCT No.: PCT/CN2019/119285
§ 371 (c)(1),
(2) Date: Dec. 22, 2019

(87) PCT Pub. No.: WO2021/082099
PCT Pub. Date: May 6, 2021

(65) Prior Publication Data
US 2021/0336171 A1 Oct. 28, 2021

(30) Foreign Application Priority Data
Oct. 28, 2019 (CN) .......................... 201911028422.9

(51) Int. Cl.
*H01L 51/50* (2006.01)
*H01L 27/32* (2006.01)
*H01L 51/52* (2006.01)
*H01L 51/56* (2006.01)

(52) U.S. Cl.
CPC .......... *H01L 51/502* (2013.01); *H01L 27/322* (2013.01); *H01L 51/5237* (2013.01); *H01L 51/5284* (2013.01); *H01L 51/56* (2013.01)

(58) Field of Classification Search
CPC .. H01L 51/502; H01L 27/322; H01L 51/5284
See application file for complete search history.

(56) References Cited

U.S. PATENT DOCUMENTS

2017/0235223 A1    8/2017   Liang

FOREIGN PATENT DOCUMENTS

| CN | 108107627 A | 6/2018 |
| CN | 108845454 A | 11/2018 |
| CN | 110262114 A | 9/2019 |

*Primary Examiner* — Anthony Ho

(57) ABSTRACT

A quantum dot color filter substrate, a manufacturing method thereof, and a display panel are provided. The quantum dot color filter substrate includes a quantum dot layer and a light-guiding encapsulation film. The quantum dot layer includes a plurality of light-guiding films arranged in an array and a black matrix disposed among the light-guiding films. A plurality of light-guiding grooves are defined on an illuminated surface of each of the light-guiding films. A light-guiding encapsulation film includes a package body disposed on a side of the quantum dot layer adjacent to the light-guiding grooves and a plurality of light-guiding protrusions extending from the package body and filled into the light-guiding grooves.

9 Claims, 2 Drawing Sheets

QUANTUM DOT COLOR FILTER SUBSTRATE, FABRICATING METHOD THEREOF, AND DISPLAY PANEL

The present application claims the priority of a Chinese patent application filed on Oct. 28, 2019 with the Chinese Patent Office, application number 201911028422.9, invention titled "quantum dot color filter substrate, manufacturing method and display panel", and the entire contents of which are incorporated herein by reference in the present application.

FIELD OF INVENTION

The present application relates to the field of display panel technologies, and in particular, to a quantum dot color filter substrate, a manufacturing method of the same, and a display panel.

BACKGROUND OF INVENTION

Quantum dot (QD) materials are increasingly used in display panels due to their adjustable wavelengths, narrow full-width at half maximum, and good stability. Currently, QD materials are mainly used for QD tube and QD film; however, these two applications are limited to liquid crystal displays (LCD). Utilizing the photoluminescence characteristics of QD materials, the QD material can be used as a color filter (CF) to greatly improve the application field of QD materials, such as organic light-emitting diode (OLED), Micro LED (light-emitting diode), etc.

Technical Problem

In conventional display panels with a quantum dot color filter substrate structure, incident light emitted from a light-emitting device to the quantum dot color filter substrate in the display panels is mostly scattered light. In the propagation process, part of the scattered light is absorbed by a black matrix (black bank material) in the quantum dot color filter substrate, resulting in lower light utilization of the display panels and darkening the display of the display panels. The current solution is to improve the luminous intensity of the light-emitting device of the display panels and make up the problem of low light utilization, but it will cause high power consumption waste.

SUMMARY OF INVENTION

Technical Solution

The embodiments of the present application provide a quantum dot color filter substrate, a manufacturing method thereof, and a display panel to solve the problem that the quantum dot color filter substrate has low utilization rate of incident light emitted from a light-emitting device in the display panels.

In a first aspect, an embodiment of the present application provides a quantum dot color filter substrate, the quantum dot color filter substrate including:

a quantum dot layer including a plurality of light-guiding films arranged in an array and a black matrix disposed among the light-guiding films, wherein a plurality of light-guiding grooves are defined on an illuminated surface of each of the light-guiding films; and a light-guiding encapsulation film including a package body disposed on a side of the quantum dot layer adjacent to the light-guiding grooves and a plurality of light-guiding protrusions extending from the package body and filled into the light-guiding grooves.

In the quantum dot color filter substrate of the embodiment of the present application, the light-guiding groove has a hemispherical shape.

In the quantum dot color filter substrate of the embodiment of the present application, the light-guiding film is a quantum dot film or a light-transparent film, and the quantum dot film includes a blue quantum dot film whose material is a blue quantum dot material, a green quantum dot film whose material is a green quantum dot material, or a red quantum dot film whose material is a red quantum dot material, and a material of the light-transparent film is transparent resin.

In the quantum dot color filter substrate of the embodiment of the present application, an encapsulation layer is disposed on a side of the quantum dot layer away from the light-guiding encapsulation film.

In the quantum dot color filter substrate of the embodiment of the present application, the quantum dot color filter substrate further including a color filter positioned on a side of the quantum dot layer away from the light-guiding groove.

In the quantum dot color filter substrate of the embodiment of the present application, the color filter includes a plurality of photoresist films corresponding to positions of the light-guiding films in the quantum dot layer.

In a second aspect, an embodiment of the present application provides a method of manufacturing a quantum dot color filter substrate, the method including:

forming a black matrix, wherein the black matrix is provided with a plurality of light-passing holes arranged in an array;

forming a light-guiding film in each of the light-passing holes, and forming a plurality of light-guiding grooves on an illuminated surface of each of the light-guiding films; and forming a light-guiding encapsulation film on the illuminated surfaces of the light-guiding films, wherein the light-guiding encapsulation film includes a package body formed on the illuminated surface of each of the light-guiding films, and a plurality of light-guiding protrusions extending from the package body and filled into the light-guiding grooves.

In the method of manufacturing the quantum dot color filter substrate of the embodiment of the present application, wherein forming the light-guiding film in each of the light-passing holes and forming the plurality of light-guiding grooves on the illuminated surface of each of the light-guiding films includes:

applying a light-guiding ink into each of the light-passing holes of the black matrix, wherein the light-guiding ink is composed of a photosensitive adhesive, a light-guiding material, and a high boiling solvent, and the light-guiding ink is cured by light to form a film surface of the light-guiding film with the plurality of light-guiding grooves in a process of volatilizing the high boiling solvent in the light-guiding ink.

In the method of manufacturing the quantum dot color filter substrate of the embodiment of the present application, the high boiling solvent accounts for 30% to 60% of a total mass fraction of the light-guiding ink.

In a second aspect, an embodiment of the present application provides a display panel, the display panel including a quantum dot color filter substrate according to any one of the foregoing quantum dot color filter substrate, and a light-emitting device disposed on a side of the quantum dot color filter substrate adjacent to the light-guiding grooves.

In the display panel of the embodiment of the present application, the light-emitting device is an organic light-emitting diode (OLED) light-emitting device that generates white light, and the light-guiding films include a blue quantum dot film, a green quantum dot film, and a red quantum dot film.

In the display panel of the embodiment of the present application, the light-emitting device is an OLED light-emitting device that generates red light, wherein the light-guiding films include a blue quantum dot film, a green quantum dot film, and a light-transparent film for transmitting the red light.

In the display panel of the embodiment of the present application, the light-emitting device is an OLED light-emitting device that generates blue light, and the light-guiding films include a light-transparent film for transmitting the blue light, a green quantum dot film, and a red quantum dot film.

In the display panel of the embodiment of the present application, the light-emitting device is an OLED light-emitting device that generates green light, and the light-guiding films include a blue quantum dot film, a light-transparent film for transmitting the green light, and a red quantum dot film.

In the display panel of the embodiment of the present application, the light-guiding groove has a hemispherical shape.

In the display panel of the embodiment of the present application, an encapsulation layer is disposed on a side of the quantum dot layer away from the light-guiding encapsulation film.

In the display panel of the embodiment of the present application, further including a color filter positioned on a side of the quantum dot layer away from the light-guiding grooves.

In the display panel of the embodiment of the present application, wherein the color filter includes a plurality of photoresist films corresponding to positions of the light-guiding films in the quantum dot layer.

Beneficial Effect

Compared with the conventional art, the present application provides a plurality of light-guiding grooves and a plurality of light-guiding protrusions filled in the light-guiding grooves on the surface of the light-guiding films. The convex structure of the light-guiding protrusions plays a role of convex mirror concentrating in the quantum dot color filter substrate, and increases optical path of the incident light transmitted in the quantum dot layer of the quantum dot color filter substrate, so that more light can pass through the quantum dot layer, reducing the probability of incident light being absorbed by the black matrix, which improves the light utilization efficiency of the incident light without increasing the luminous intensity of the light-emitting device. Meanwhile, during the process of volatilizing the high boiling solvent in the light-guiding ink, the surface of the light-guiding ink is continuously formed into concave structures, the light-guiding ink is cured by light to form a film surface of the light-guiding film with the plurality of light-guiding grooves, and then a plurality of light-guiding protrusions are formed in the light-guiding grooves. The manufacturing method is suitable for mass production, the technique is mature, and the product quality is stable. The light utilization efficiency in the display panel is improved, power consumption of the display panels is reduced, and the service life of the display panels is prolonged.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF EMBODIMENTS

The present application provides a quantum dot color filter substrate, a manufacturing method, and a display panel. In order to make the objects, technical solutions, and effects of the present application clearer, the present application will be further described in detail below with reference to the accompanying drawings. It is understood that the specific embodiments described herein are merely illustrative of the application and are not intended to be limiting.

Figure 2:
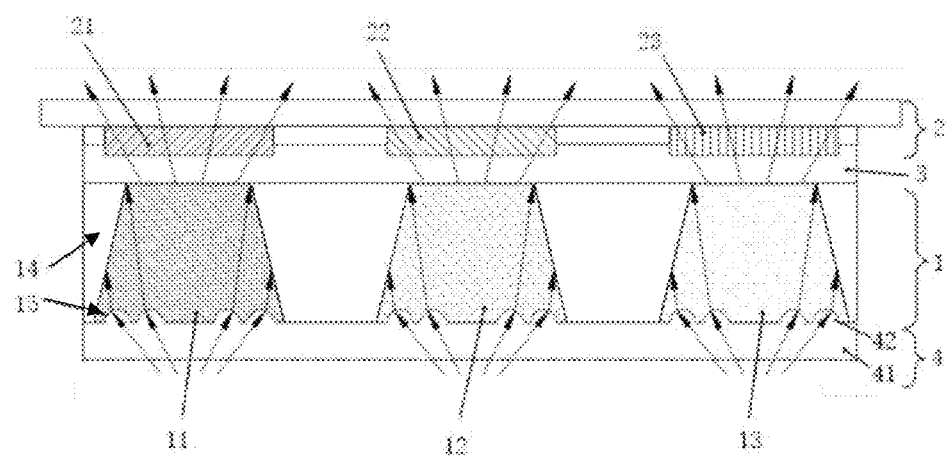
FIG. 2 is a schematic structural diagram of a quantum dot color filter substrate according to an embodiment of the present application.

As shown in FIG. 2, an embodiment of the present application provides a quantum dot color filter substrate. The quantum dot color filter substrate including a quantum dot layer 1 which includes a plurality of light-guiding films arranged in an array, a black matrix 14 disposed among the light-guiding films, and a plurality of light-guiding grooves 15 provided on an illuminated surface of each of the light-guiding films, wherein the black matrix is used to avoid mutual interference of light passing through different light-guiding films; and a light-guiding encapsulation film 4 includes a package body 41 disposed on a side of the quantum dot layer 1 adjacent to the light-guiding grooves 15, and a plurality of light-guiding protrusions 42 extending from the package body 41 and filled into the light-guiding grooves 15.

It can be understood that, as shown in FIG. 2, in one embodiment, the illuminated surface of the light-guiding film, that is, a side of the light-guiding film close to a light-emitting device in a specific use process of the quantum dot color filter substrate of the present application. For example, in a display panel having the quantum dot color filter substrate of the present application, in one embodiment, the light-emitting device in the display panel is a blue light-emitting device, such as a blue organic light-emitting diode (OLED), etc., but it is not limited thereto, and can be a light-emitting device that generates light of other colors, such as a light-emitting device that generates red light, a light-emitting device that generates green light, or the like. The illuminated surface of the light-guiding film, that is, a side of the light-guiding film is close to the light-emitting diode (blue OLED). Unless otherwise specified, the quantum dot color filter substrate of the present application will be described by taking a light-emitting device that generates blue light as an example.

Figure 1:
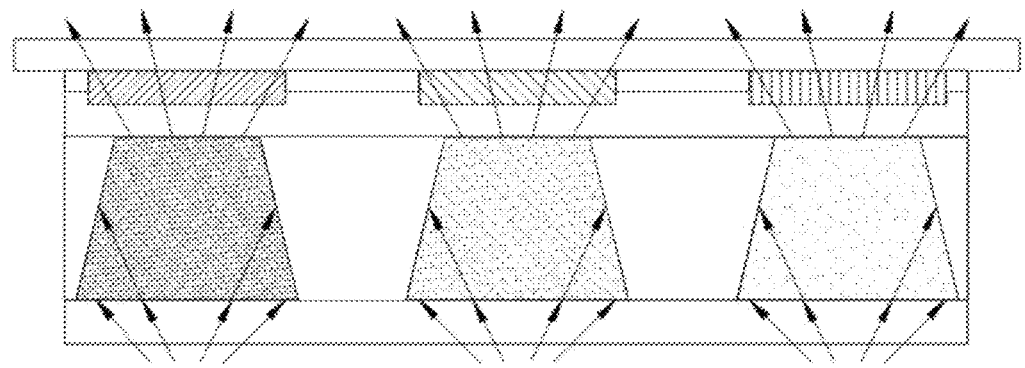
FIG. 1 is a schematic view showing a light-guiding effect of a conventional quantum dot color filter substrate.

In an embodiment, the light-guiding grooves 15 are covered with the light-guiding films, the light-guiding protrusion 42 is filled in each of the light-guiding grooves 15. As shown in FIG. 2., part of the light-guiding grooves 15 perform light-guiding effect on the surfaces of the light-guiding films illustrated, wherein the solid arrow indicates the transmitting direction of the light emitted from the light-emitting device. Compared with the light-guiding effect of the conventional quantum dot color filter substrate shown in FIG. 1, it is obvious that in the quantum dot color filter substrate of the present application, a convex structure of each of the light-guiding protrusions 42 acts as a convex mirror concentrating the light, and increases optical path of the incident light transmitted in the quantum dot layer 1 of the quantum dot color filter substrate, so that more light can pass through the quantum dot layer 1. Specifically, each of the light-guiding grooves has a hemispherical shape, and of course, it can also be other concave structures.

In one embodiment, the light-guiding film is a quantum dot films or a light-transparent film. The quantum dot film includes a blue quantum dot film whose material is a blue quantum dot material, a green quantum dot film whose material is a green quantum dot material, or a red quantum dot film whose material is a red quantum dot material. Obviously, the quantum dot film can also be a quantum dot film whose material is other color quantum dot materials, and the material of the light-transparent film is a transparent resin material. In FIG. 2, only part of a structure of the quantum dot layer 1 is shown. The components corresponding to the reference numerals 11, 12, and 13 in the figure are the light-guiding films, including a first light-guiding film 11, a second light-guiding film 12, and a third light-guiding film 13. Specifically, positions of the respective light-guiding films correspond to a red (R) sub-pixel region, a green (G) sub-pixel region, and a blue (B) sub-pixel region from left to right. As described above, when the light-emitting device is a light-emitting device that generates blue light (such as a blue OLED), in this case, in FIG. 2, in each light-guiding film, the first light-guiding film 11 is a red quantum dot film, and the second light-guiding film 12 is a green quantum dot film, and the third light-guiding film 13 is a light-transparent film.

In an embodiment, a side of the quantum dot layer away from the light-guiding encapsulation film 4 is provided with an encapsulation layer 3. As shown in FIG. 2, the encapsulating layer 3 and the light-guiding encapsulation film 4 are matched with the black matrix 14 for encapsulating each of the light-guiding films to avoid external interference of the light-guiding films, ensuring the stability of working environment of the light-guiding films.

In an embodiment, a color filter 2 is further disposed on the side of the quantum dot layer 1 away from the light-guiding grooves 15, wherein the color filter 2 includes a plurality of photoresist films corresponding to positions of the light-guiding films in the quantum dot layer 1. Specifically, a red photoresist film, a green photoresist film, and a blue photoresist film corresponding to the red (R) sub-pixel region, the green (G) sub-pixel region, and the blue (B) sub-pixel region, respectively. For example, as shown in FIG. 2, the photoresist film includes a red photoresist film 21 corresponding to the position of the first light-guiding film 11 (red quantum dot film), a green photoresist film 22 corresponding to the position of the second light-guiding film 12 (green quantum dot film), and a blue photoresist film 23 corresponding to the position of the third light-guiding film 13 (light-transparent film).

In summary, the present application provides a plurality of light-guiding grooves and a plurality of light-guiding protrusions filled in the light-guiding grooves on the surface of the light-guiding film, the convex structure of each of the light-guiding protrusions plays a role of convex mirror concentrating in the quantum dot color filter substrate, and increases optical path of the incident light transmitted in the quantum dot layer of the quantum dot color filter substrate, so that more light can pass through the quantum dot layer, reducing the probability of incident light being absorbed by the black matrix, which improves the light utilization efficiency of the incident light without increasing the luminous intensity of the light-emitting device.

Figure 3:
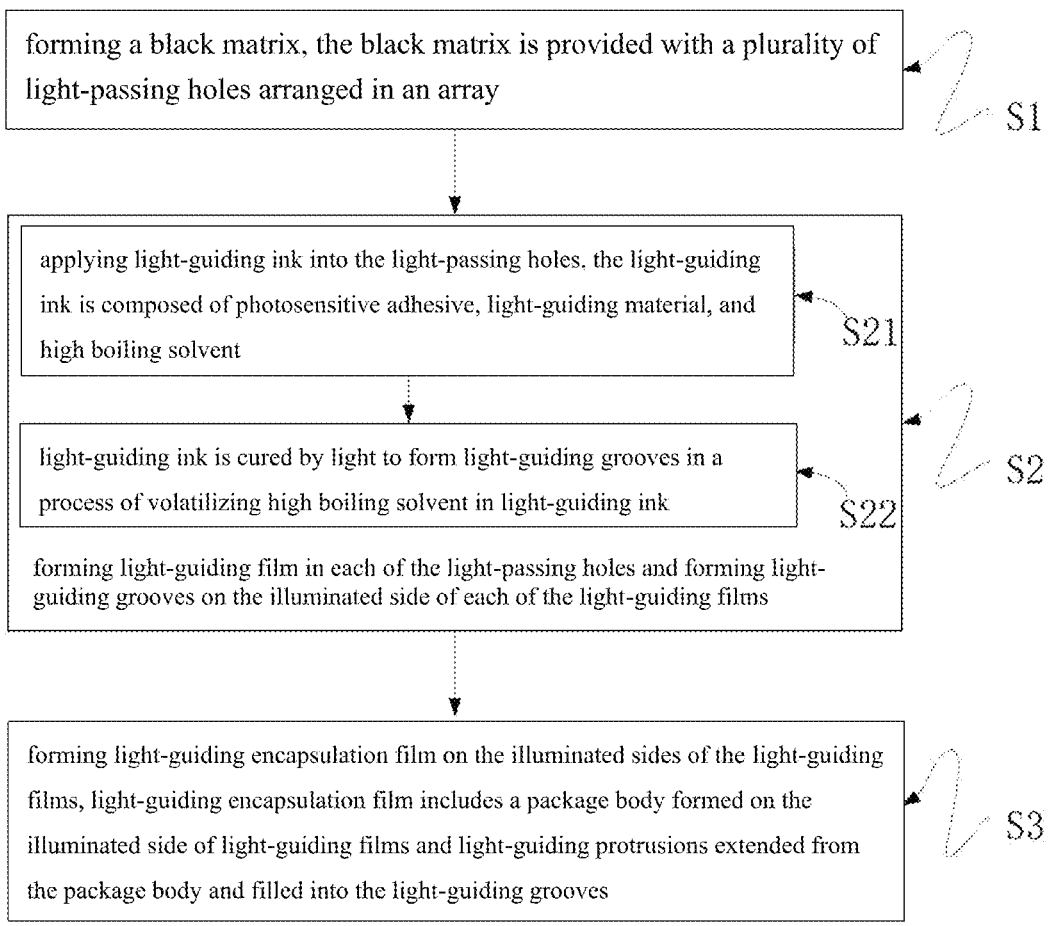
FIG. 3 is a schematic flowchart showing a method of manufacturing the quantum dot color filter substrate according to an embodiment of the present application.

The present application also provides a method of manufacturing the quantum dot color filter substrate, as shown in FIG. 3, including:

step S1, forming a black matrix, wherein the black matrix is provided with a plurality of light-passing holes arranged in an array;

step S2, forming a light-guiding film in each of the light-passing holes, and forming a plurality of light-guiding grooves on an illuminated surface of each of the light-guiding films;

step S3, forming a light-guiding encapsulation film on the illuminated surface of the light-guiding films, wherein the light-guiding encapsulation film includes a package body formed on the illuminated surface of each of the light-guiding films, and a plurality of light-guiding protrusions extending from the package body and filled into the light-guiding grooves.

In an embodiment, the step S1, forming the black matrix, the black matrix is provided with the plurality of light-passing holes arranged in an array; the black matrix is formed on a substrate, and the substrate includes aforementioned the color filter and the encapsulation layer. The method of manufacturing the substrate including the color filter and the encapsulation layer is a technical method well known to those skilled in the art, and details are not described herein. Specifically, the black matrix is formed on the encapsulation layer, forming a photoresist layer on the encapsulation layer by using a photoresist material, and then patterning the photoresist layer to form the black matrix, so that the black matrix is provided with a plurality of light-passing holes arranged in an array.

In an embodiment, the step S2: forming the light-guiding film in each of the light-passing holes and forming a plurality of light-guiding grooves on the illuminated surface of each of the light-guiding films, specifically including:

step S21, applying a light-guiding ink into each of the light-passing holes of the black matrix, wherein the light-guiding ink is composed of a photosensitive adhesive, a light-guiding material, and a high boiling solvent; and step S22, wherein the light-guiding ink is cured by light to form a film surface of the light-guiding film with the plurality of light-guiding grooves in a process of volatilizing the high boiling solvent in the light-guiding ink.

In an embodiment, a method of forming the film surface of the light-guiding film with the plurality of light-guiding grooves in the black matrix can be byprinting the light-guiding ink through inkjet printing. Specifically, the surface of the light-guiding ink forms a continuous concave and convex surface by a relatively intense process of volatilization of a high boiling solvent, and then, in the process of volatilizing the high boiling solvent, the light-guiding ink is irradiated by ultraviolet light, and the light-guiding ink is solidified by the photosensitive glue to finally form the light-guiding film having the plurality of light-guiding grooves.

In one embodiment, the light-guiding ink is composed of a photosensitive glue, a light-guiding material, and a high boiling solvent; specifically, the high boiling solvent accounts for 30% to 60% of a total mass fraction of the light-guiding ink. Obviously, when a percentage of the total mass fraction of the light-guiding ink occupied by the high boiling solvent is too low, this causes the volatilization process to be insufficiently intense, so that a size of the finally formed light-guiding groove is too small or the distribution is not dense enough. When a percentage of the total mass fraction of the light-guiding ink occupied by the high boiling solvent is too high, the corresponding light-guiding material (quantum dot material or transparent resin material) is too low, which affects the normal function of the quantum dot layer.

Specifically, when the formed light-guiding film is a quantum dot film, the light-guiding material in the light-guiding ink is a quantum dot material. When the formed light-guiding film is a light-transparent film, the light-guiding material in the light-guiding ink is a transparent resin material. Obviously, when the formed light-guiding film is a red quantum dot film, the light-guiding material in the light-guiding ink is a red quantum dot material. When the formed light-guiding film is a green quantum dot film, the light-guiding material in the light-guiding ink is a green quantum dot material. When the formed light-guiding film is a blue quantum dot film, the light-guiding material in the light-guiding ink is a blue quantum dot material.

It can be understood that after the light-guiding film is completed, that is, after the quantum dot layer is formed, the light-guiding encapsulation film and the encapsulating layer are formed on the quantum dot layer, thereby completing a package of the light-guiding film. Obviously, after the entire manufacturing process, the light-guiding grooves are formed on the side of the light-guiding film away from the color filter.

In summary, in the present application through a process of volatilizing a high boiling solvent in a light-guiding ink, at this time, the surface of the light-guiding ink continuously forms concave structures, and the light-guiding ink is cured by light to form a surface of the light-guiding film having a plurality of light-guiding grooves. Then, packaging is performed to form a light-guiding encapsulation film filled with the light-guiding protrusions. The manufacturing method is suitable for mass production, the technique is mature, and the product quality is stable. Moreover, the light-guiding grooves are fully arranged in the surface of the light-guiding film.

The present application further provides a display panel including any one of the foregoing quantum dot color filter substrates, and a light-emitting device disposed on a side of the quantum dot color filter substrate adjacent to the light-guiding grooves.

In one embodiment, the light-emitting device is an OLED light-emitting device that generates white light, and the light-guiding films include a blue quantum dot film, a green quantum dot film, and a red quantum dot film; or the light-emitting device is an OLED light-emitting device that generates red light, and the light-guiding films include a blue quantum dot film, a green quantum dot film, and a light-transparent film for transmitting the red light; or the light-emitting device is an OLED light-emitting device that generates blue light, and the light-guiding films include a light-transparent film for transmitting the blue light, a green quantum dot film, and a red quantum dot film; or the light-emitting device is an OLED light-emitting device that generates green light, and the light-guiding films include a blue quantum dot film, a light-transparent film for transmitting the green light, and a red quantum dot film.

Specifically, for the light-emitting device that generates light of different colors, as shown in FIG. 2, when the light-emitting device is an OLED light-emitting device that generates white light, the first light-guiding film 11 is a red quantum dot film, the second light-guiding film 12 is a green quantum dot film, and the third light-guiding film 13 is a blue quantum dot film.

When the light-emitting device is an OLED light-emitting device that generates red light, the first light-guiding film 11 is a light-transparent film for transmitting the red light, the second light-guiding film 12 is a green quantum dot film, and the third light-guide film 13 is a blue quantum dot film.

When the light-emitting device is an OLED light-emitting device that generates blue light, the first light-guiding film 11 is a red quantum dot film, the second light-guiding film 12 is a green quantum dot film, and the third light-guiding film 13 is a light-transparent film for transmitting the blue light.

When the light-emitting device is an OLED light-emitting device that generates green light, the first light-guiding film 11 is a red quantum dot film, the second light-guiding film 12 is a light-transparent film for transmitting the green light, and the third light-guiding film 13 is a blue quantum dot film.

In summary, the quantum dot color filter substrate of the present application has a strong adaptability. According to the different colors of light-emitting devices in the display panel, there should be different combination forms of light-guiding films. It also improves the light utilization ratio of the display panel, reduces the power consumption of the display panel, and extends the service life of the display panel.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A quantum dot color filter substrate, comprising:
    a quantum dot layer comprising a plurality of light-guiding films arranged in an array and a black matrix disposed among the light-guiding films, wherein an entire side surface of the black matrix is in contact with the light-guiding films, a plurality of light-guiding grooves are defined on an illuminated surface of each of the light-guiding films, each of the light-guiding films is integrally provided with the light-guiding grooves, and each light-guiding groove has a hemispherical shape;
    a light-guiding encapsulation film comprising a package body disposed on a side of the quantum dot layer adjacent to the light-guiding grooves and a plurality of light-guiding protrusions extending from the package body and filled into the light-guiding grooves, wherein the package body is integrally provided with the light-guiding protrusions; and a color filter positioned on a side of the quantum dot layer away from the light-guiding grooves, wherein the color filter comprises a plurality of photoresist films corresponding to positions of the light-guiding films in the quantum dot layer.

2. The quantum dot color filter substrate of claim 1, wherein each light-guiding film is a quantum dot film or a light-transparent film, and the quantum dot films comprise a blue quantum dot film whose material is a blue quantum dot material, a green quantum dot film whose material is a green quantum dot material, or a red quantum dot film whose material is a red quantum dot material, and a material of the light-transparent films is transparent resin.

3. The quantum dot color filter substrate of claim 1, wherein an encapsulation layer is disposed on a side of the quantum dot layer away from the light-guiding encapsulation film.

4. A display panel, comprising the quantum dot color filter substrate of claim 1 and a light-emitting device disposed on a side of the quantum dot color filter substrate adjacent to the light-guiding grooves.

5. The display panel of claim 4, wherein the light-emitting device is an organic light-emitting diode (OLED) light-emitting device that generates white light, and the light-guiding films comprise a blue quantum dot film, a green quantum dot film, and a red quantum dot film.

6. The display panel of claim 4, wherein the light-emitting device is an organic light-emitting diode (OLED) light-emitting device that generates red light, wherein the light-guiding films comprise a blue quantum dot film, a green quantum dot film, and a light-transparent film for transmitting the red light.

7. The display panel of claim 4, wherein the light-emitting device is an organic light-emitting diode (OLED) light-emitting device that generates blue light, and the light-guiding films comprise a light-transparent film for transmitting the blue light, a green quantum dot film, and a red quantum dot film.

8. The display panel of claim 4, wherein the light-emitting device is an organic light-emitting diode (OLED) light-emitting device that generates green light, and the light-guiding films comprise a blue quantum dot film, a light-transparent film for transmitting the green light, and a red quantum dot film.

9. The display panel of claim 4, wherein an encapsulation layer is disposed on a side of the quantum dot layer away from the light-guiding encapsulation film.

* * * * *